United States Patent
Schmidhammer

(10) Patent No.: US 10,164,607 B1
(45) Date of Patent: Dec. 25, 2018

(54) ADJUSTABLE CONDENSER

(71) Applicant: SNAPTRACK, INC., San Diego, CA (US)

(72) Inventor: Edgar Schmidhammer, Munich (DE)

(73) Assignee: SnapTrack, Inc., San Diego, CA (US)

(*) Notice: Subject to any disclaimer, the term of this patent is extended or adjusted under 35 U.S.C. 154(b) by 0 days.

(21) Appl. No.: 15/704,554

(22) Filed: Sep. 14, 2017

(51) Int. Cl.
  *H03H 11/20* (2006.01)
  *H01L 29/94* (2006.01)
  *H01L 27/06* (2006.01)

(52) U.S. Cl.
  CPC .......... *H03H 11/20* (2013.01); *H01L 27/0611* (2013.01); *H01L 29/94* (2013.01); *H03H 2210/025* (2013.01)

(58) Field of Classification Search
  CPC ............................... H03H 11/20; H03H 11/362
  See application file for complete search history.

(56) References Cited

U.S. PATENT DOCUMENTS

| | | | | |
|---|---|---|---|---|
| 5,701,107 | A | * | 12/1997 | Kasahara ............ H03H 7/20 333/139 |
| 8,212,632 | B2 | * | 7/2012 | Miya .................. H03H 11/20 333/139 |
| 8,405,473 | B2 | | 3/2013 | Asahi |
| 9,641,201 | B2 | | 5/2017 | Bakalski et al. |
| 9,806,694 | B2 | * | 10/2017 | Reedy .................. H03H 11/28 |
| 2007/0188255 | A1 | | 8/2007 | Strandberg |
| 2014/0187178 | A1 | | 7/2014 | Yang et al. |
| 2016/0204820 | A1 | | 7/2016 | Mow et al. |

* cited by examiner

*Primary Examiner* — Jeffrey S Zweizig
(74) *Attorney, Agent, or Firm* — Patterson & Sheridan, L.L.P.

(57) ABSTRACT

Certain aspects of the present disclosure are generally directed to an integrated circuit device. The integrated circuit device generally includes a capacitive element, a first switch having a first terminal coupled to a first terminal of a capacitive element, and a second switch coupled between the first terminal and a second terminal of the capacitive element in the integrated circuit device.

17 Claims, 17 Drawing Sheets

ADJUSTABLE CONDENSER

TECHNICAL FIELD

Certain aspects of the present disclosure generally relate to electronic circuits and, more particularly, to adjustable condensers.

BACKGROUND

A wireless communication network may include a number of base stations that can support communication for a number of mobile stations. A mobile station (MS) may communicate with a base station (BS) via a downlink and an uplink. The downlink (or forward link) refers to the communication link from the base station to the mobile station, and the uplink (or reverse link) refers to the communication link from the mobile station to the base station. A base station may transmit data and control information on the downlink to a mobile station and/or may receive data and control information on the uplink from the mobile station. The base station and/or mobile station may include one or more filters and/or phase shifters to filter signals or adjust a phase of a signal for transmission or a received signal.

SUMMARY

Certain aspects of the present disclosure generally relate to a reconfigurable capacitor.

Certain aspects of the present disclosure provide an integrated circuit device. The integrated circuit device generally includes a capacitive element, a first switch having a first terminal coupled to a first terminal of the capacitive element, and a second switch coupled between the first terminal and a second terminal of the capacitive element in the integrated circuit device.

Certain aspects of the present disclosure provide a method for controlling operations of an integrated circuit device. The method generally includes controlling a first switch having a first terminal coupled to a first terminal of a capacitive element, and controlling a second switch coupled between the first terminal and a second terminal of the capacitive element of the integrated circuit device.

Certain aspects of the present disclosure provide an apparatus for processing a signal. The apparatus generally includes means for selectively coupling a first terminal to a second terminal of a capacitive element in an integrated circuit device, and means for selectively coupling the first terminal of the capacitive element to a node of the integrated circuit device.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain aspects of this disclosure and are therefore not to be considered limiting of its scope, for the description may admit to other equally effective aspects.

DETAILED DESCRIPTION

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein, one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim.

The word "exemplary" is used herein to mean "serving as an example, instance, or illustration." Any aspect described herein as "exemplary" is not necessarily to be construed as preferred or advantageous over other aspects.

As used herein, the term "connected with" in the various tenses of the verb "connect" may mean that element A is directly connected to element B or that other elements may be connected between elements A and B (i.e., that element A is indirectly connected with element B). In the case of electrical components, the term "connected with" may also be used herein to mean that a wire, trace, or other electrically conductive material is used to electrically connect elements A and B (and any components electrically connected therebetween).

An Example Wireless System

Figure 1:
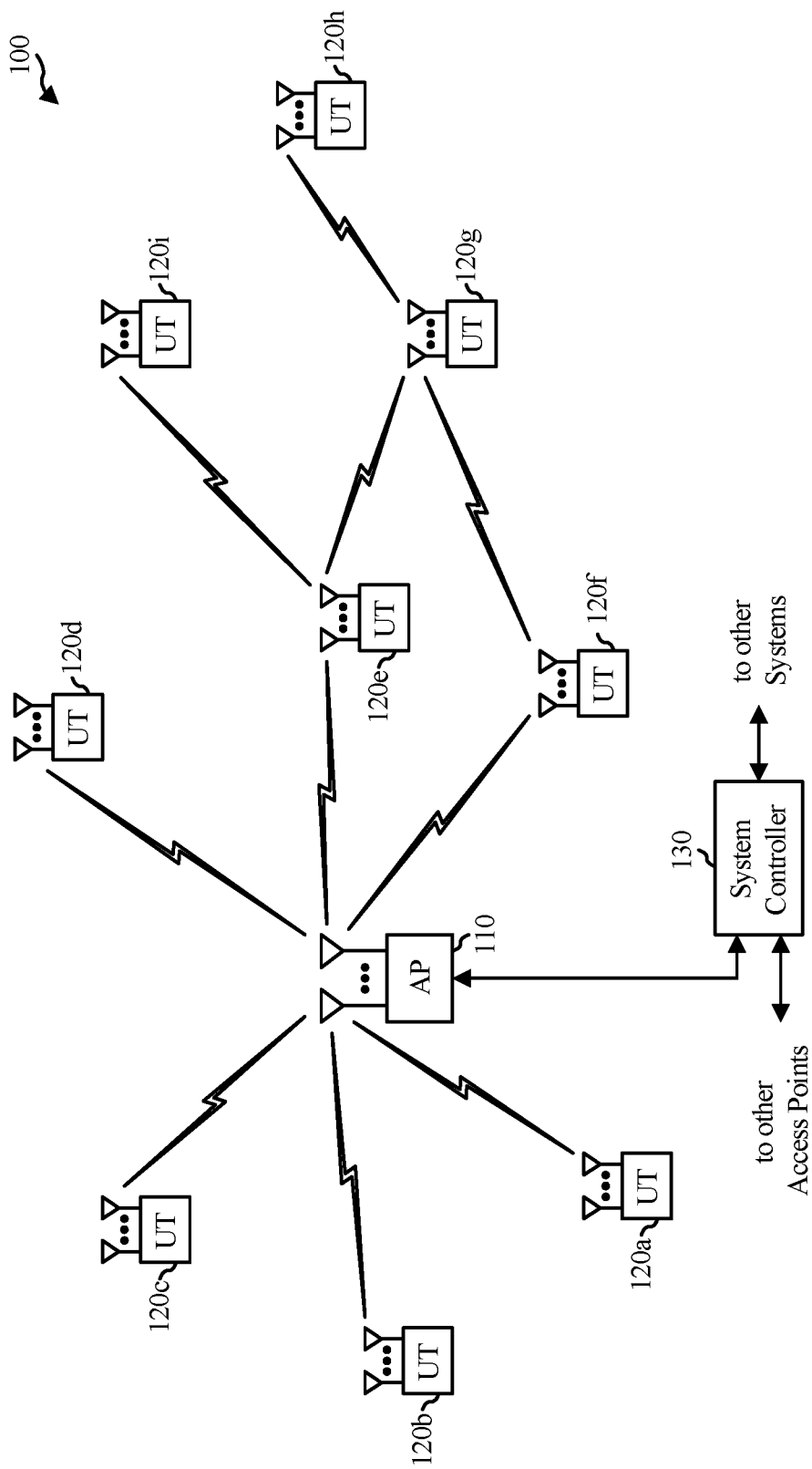
FIG. 1 is a diagram of an example wireless communications network, in accordance with certain aspects of the present disclosure.

FIG. 1 illustrates a wireless communications system 100 with access points 110 and user terminals 120, in which aspects of the present disclosure may be practiced. For simplicity, only one access point 110 is shown in FIG. 1. An access point (AP) is generally a fixed station that communicates with the user terminals and may also be referred to as a base station (BS), an evolved Node B (eNB), or some other terminology. A user terminal (UT) may be fixed or mobile and may also be referred to as a mobile station (MS), an access terminal, user equipment (UE), a station (STA), a client, a wireless device, or some other terminology. A user terminal may be a wireless device, such as a cellular phone, a personal digital assistant (PDA), a handheld device, a wireless modem, a laptop computer, a tablet, a personal computer, etc.

Access point 110 may communicate with one or more user terminals 120 at any given moment on the downlink and uplink. The downlink (i.e., forward link) is the communication link from the access point to the user terminals, and the uplink (i.e., reverse link) is the communication link from the user terminals to the access point. A user terminal may also communicate peer-to-peer with another user terminal. A system controller 130 couples to and provides coordination and control for the access points.

Wireless communications system 100 employs multiple transmit and multiple receive antennas for data transmission on the downlink and uplink. Access point 110 may be equipped with a number $N_{ap}$ of antennas to achieve transmit diversity for downlink transmissions and/or receive diversity for uplink transmissions. A set $N_u$ of selected user terminals 120 may receive downlink transmissions and transmit uplink transmissions. Each selected user terminal transmits user-specific data to and/or receives user-specific data from the access point. In general, each selected user terminal may be equipped with one or multiple antennas (i.e., $N_{ut} \geq 1$). The $N_u$ selected user terminals can have the same or different number of antennas.

Wireless communications system 100 may be a time division duplex (TDD) system or a frequency division duplex (FDD) system. For a TDD system, the downlink and uplink share the same frequency band. For an FDD system, the downlink and uplink use different frequency bands. Wireless communications system 100 may also utilize a single carrier or multiple carriers for transmission. Each user terminal 120 may be equipped with a single antenna (e.g., to keep costs down) or multiple antennas (e.g., where the additional cost can be supported). In certain aspects of the present disclosure, the access point 110 and/or user terminal 120 may include one or more reconfigurable circuits (e.g., filter or phase adjustment circuitry) for processing signals, as described in more detail herein.

Figure 2:
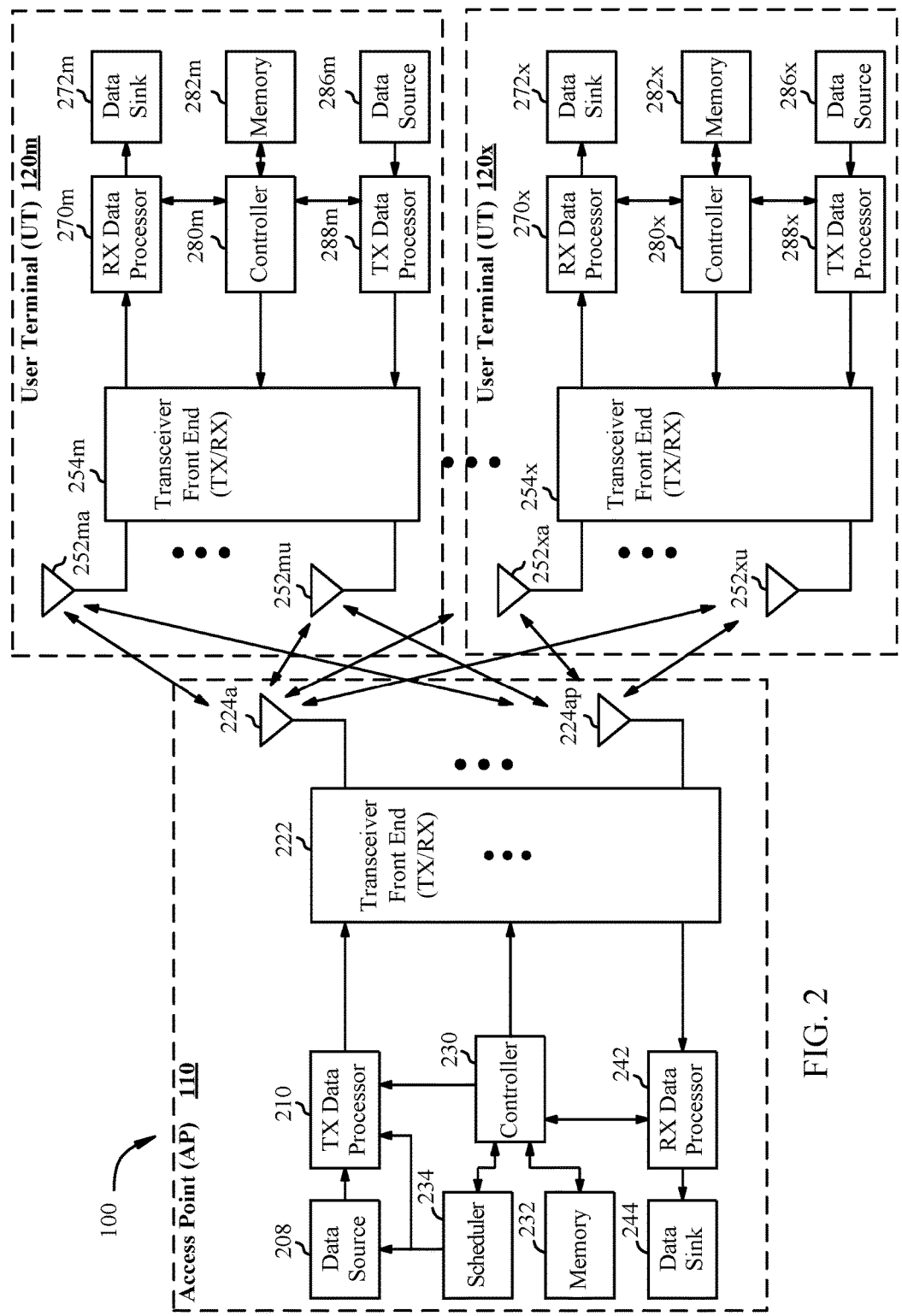
FIG. 2 is a block diagram of an example access point (AP) and example user terminals, in accordance with certain aspects of the present disclosure.

FIG. 2 shows a block diagram of access point 110 and two user terminals 120m and 120x in the wireless communications system 100. Access point 110 is equipped with $N_{ap}$ antennas 224a through 224ap. User terminal 120m is equipped with $N_{ut,m}$ antennas 252ma through 252mu, and user terminal 120x is equipped with $N_{ut,x}$ antennas 252xa through 252xu. Access point 110 is a transmitting entity for the downlink and a receiving entity for the uplink. Each user terminal 120 is a transmitting entity for the uplink and a receiving entity for the downlink. As used herein, a "transmitting entity" is an independently operated apparatus or device capable of transmitting data via a frequency channel, and a "receiving entity" is an independently operated apparatus or device capable of receiving data via a frequency channel. In the following description, the subscript "dn" denotes the downlink, the subscript "up" denotes the uplink, $N_{up}$ user terminals are selected for simultaneous transmission on the uplink, $N_{dn}$ user terminals are selected for simultaneous transmission on the downlink, $N_{up}$ may or may not be equal to $N_{dn}$, and $N_{up}$ and $N_{dn}$ may be static values or can change for each scheduling interval. Beam-steering or some other spatial processing technique may be used at the access point and user terminal.

On the uplink, at each user terminal 120 selected for uplink transmission, a TX data processor 288 receives traffic data from a data source 286 and control data from a controller 280. TX data processor 288 processes (e.g., encodes, interleaves, and modulates) the traffic data $\{d_{up}\}$ for the user terminal based on the coding and modulation schemes associated with the rate selected for the user terminal and provides a data symbol stream $\{s_{up}\}$ for one of the $N_{ut,m}$ antennas. A transceiver front end (TX/RX) 254 (also known as a radio frequency front end (RFFE)) receives and processes (e.g., converts to analog, amplifies, filters, and frequency upconverts) a respective symbol stream to generate an uplink signal. The transceiver front end 254 may also route the uplink signal to one of the $N_{ut,m}$ antennas for transmit diversity via a radio-frequency (RF) switch, for example. The controller 280 may control the routing within the transceiver front end 254. Memory 282 may store data and program codes for the user terminal 120 and may interface with the controller 280.

A number $N_{up}$ of user terminals 120 may be scheduled for simultaneous transmission on the uplink. Each of these user terminals transmits its set of processed symbol streams on the uplink to the access point.

At access point 110, $N_{ap}$ antennas 224a through 224ap receive the uplink signals from all $N_{up}$ user terminals transmitting on the uplink. For receive diversity, a transceiver front end 222 may select signals received from one of the antennas 224 for processing. The signals received from multiple antennas 224 may be combined for enhanced receive diversity. The access point's transceiver front end 222 also performs processing complementary to that performed by the user terminal's transceiver front end 254 and provides a recovered uplink data symbol stream. The recovered uplink data symbol stream is an estimate of a data symbol stream {$s_{up}$} transmitted by a user terminal. An RX data processor 242 processes (e.g., demodulates, deinterleaves, and decodes) the recovered uplink data symbol stream in accordance with the rate used for that stream to obtain decoded data. The decoded data for each user terminal may be provided to a data sink 244 for storage and/or a controller 230 for further processing. The transceiver front end (TX/RX) 222 of access point 110 and/or transceiver front end 254 of user terminal 120 may include one or more reconfigurable circuits (e.g., filter or phase adjustment circuitry) for processing signals, as described in more detail herein.

On the downlink, at access point 110, a TX data processor 210 receives traffic data from a data source 208 for $N_{dn}$ user terminals scheduled for downlink transmission, control data from a controller 230 and possibly other data from a scheduler 234. The various types of data may be sent on different transport channels. TX data processor 210 processes (e.g., encodes, interleaves, and modulates) the traffic data for each user terminal based on the rate selected for that user terminal. TX data processor 210 may provide a downlink data symbol streams for one of more of the $N_{dn}$ user terminals to be transmitted from one of the $N_{ap}$ antennas. The transceiver front end 222 receives and processes (e.g., converts to analog, amplifies, filters, and frequency upconverts) the symbol stream to generate a downlink signal. The transceiver front end 222 may also route the downlink signal to one or more of the $N_{ap}$ antennas 224 for transmit diversity via an RF switch, for example. The controller 230 may control the routing within the transceiver front end 222. Memory 232 may store data and program codes for the access point 110 and may interface with the controller 230.

At each user terminal 120, $N_{ut,m}$ antennas 252 receive the downlink signals from access point 110. For receive diversity at the user terminal 120, the transceiver front end 254 may select signals received from one of the antennas 252 for processing. The signals received from multiple antennas 252 may be combined for enhanced receive diversity. The user terminal's transceiver front end 254 also performs processing complementary to that performed by the access point's transceiver front end 222 and provides a recovered downlink data symbol stream. An RX data processor 270 processes (e.g., demodulates, deinterleaves, and decodes) the recovered downlink data symbol stream to obtain decoded data for the user terminal.

Figure 3:
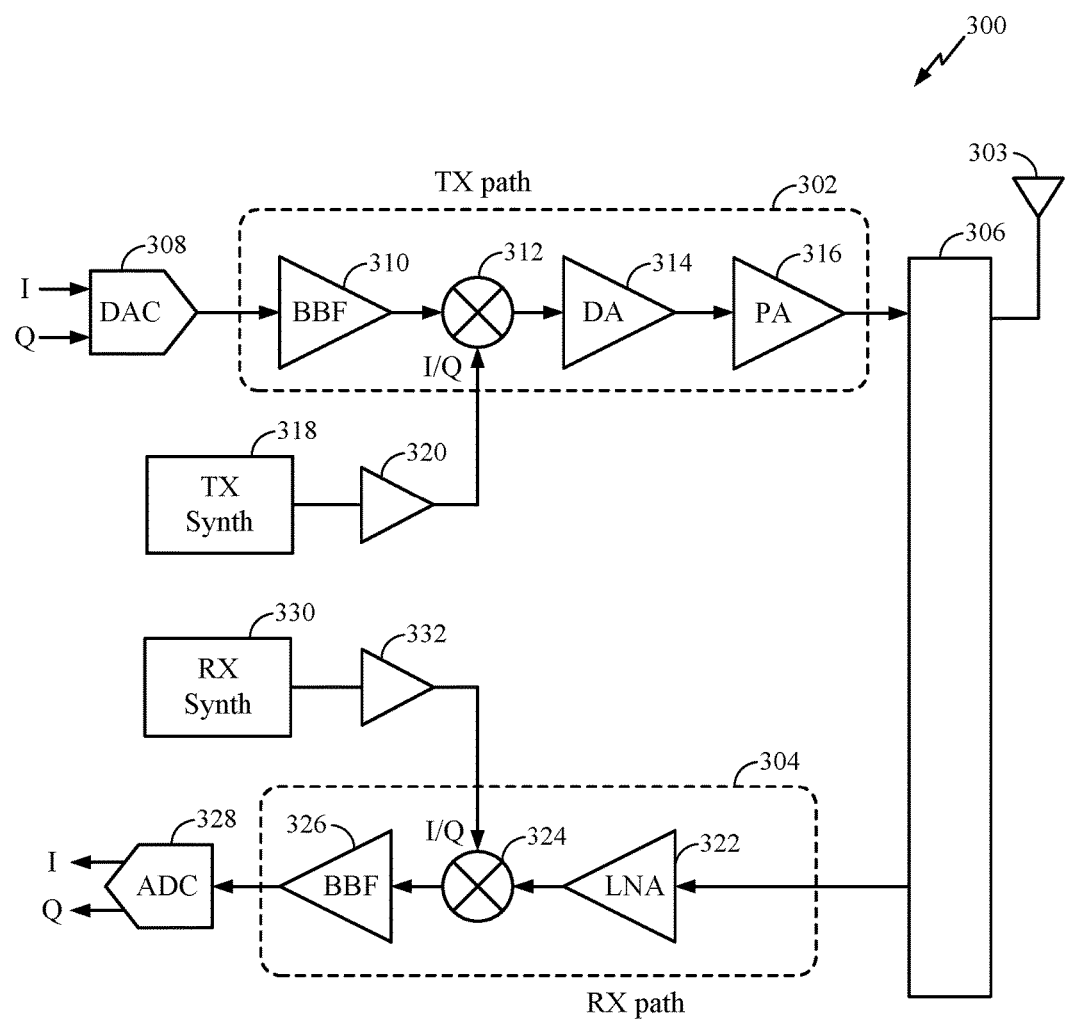
FIG. 3 is a block diagram of an example transceiver front end, in accordance with certain aspects of the present disclosure.

FIG. 3 is a block diagram of an example transceiver front end 300, such as transceiver front ends 222, 254 in FIG. 2, in which aspects of the present disclosure may be practiced. The transceiver front end 300 includes a transmit (TX) path 302 (also known as a transmit chain) for transmitting signals via one or more antennas and a receive (RX) path 304 (also known as a receive chain) for receiving signals via the antennas. When the TX path 302 and the RX path 304 share an antenna 303, the paths may be connected with the antenna via an interface 306, which may include any of various suitable RF devices, such as a duplexer, a switch, a diplexer, and the like. In certain aspects, the transceiver front end 300 may include one or more reconfigurable circuits (e.g., filter or phase adjustment circuitry) for processing signals. For example, the duplexer of interface 306 may be coupled to a reconfigurable filter or phase adjustment circuit, as described in more detail herein.

Receiving in-phase (I) or quadrature (Q) baseband analog signals from a digital-to-analog converter (DAC) 308, the TX path 302 may include a baseband filter (BBF) 310, a mixer 312, a driver amplifier (DA) 314, and a power amplifier (PA) 316. The BBF 310, the mixer 312, and the DA 314 may be included in a radio frequency integrated circuit (RFIC), while the PA 316 may be external to the RFIC. In some aspects of the present disclosure, the BBF 310 may include a tunable active filter as described below. The BBF 310 filters the baseband signals received from the DAC 308, and the mixer 312 mixes the filtered baseband signals with a transmit local oscillator (LO) signal to convert the baseband signal of interest to a different frequency (e.g., upconvert from baseband to RF). This frequency conversion process produces the sum and difference frequencies of the LO frequency and the frequency of the signal of interest. The sum and difference frequencies are referred to as the beat frequencies. The beat frequencies are typically in the RF range, such that the signals output by the mixer 312 are typically RF signals, which may be amplified by the DA 314 and/or by the PA 316 before transmission by the antenna 303.

The RX path 304 includes a low noise amplifier (LNA) 322, a mixer 324, and a baseband filter (BBF) 326. In some aspects of the present disclosure, the BBF 326 may include a tunable active filter as described below. The LNA 322, the mixer 324, and the BBF 326 may be included in a radio frequency integrated circuit (RFIC), which may or may not be the same RFIC that includes the TX path components. RF signals received via the antenna 303 may be amplified by the LNA 322, and the mixer 324 mixes the amplified RF signals with a receive local oscillator (LO) signal to convert the RF signal of interest to a different baseband frequency (i.e., downconvert). The baseband signals output by the mixer 324 may be filtered by the BBF 326 before being converted by an analog-to-digital converter (ADC) 328 to digital I or Q signals for digital signal processing.

While it is desirable for the output of an LO to remain stable in frequency, tuning the LO to different frequencies typically involves using a variable-frequency oscillator, which involves compromises between stability and tunability. Contemporary systems may employ frequency synthesizers with a voltage-controlled oscillator (VCO) to generate a stable, tunable LO with a particular tuning range. Thus, the transmit LO frequency may be produced by a TX frequency synthesizer 318, which may be buffered or amplified by amplifier 320 before being mixed with the baseband signals in the mixer 312. Similarly, the receive LO frequency may be produced by an RX frequency synthesizer 330, which may be buffered or amplified by amplifier 332 before being mixed with the RF signals in the mixer 324. While FIGS. 1-3 provide a wireless communication system as an example application in which certain aspects of the present disclosure may be implemented to facilitate understanding, certain aspects provided herein can be implemented in any of various other suitable systems.

Example Adjustable Condenser

Carrier aggregation (CA) uses highly flexible filters and duplexers to satisfy the specifications of wireless devices (e.g., mobile stations and/or base stations). In order to obtain a high degree of flexibility, adjustable condensers (also referred to as "capacitors") are increasingly used in wireless devices, and are especially important in high-frequency (HF) portions of wireless devices. For example, capacitors may be used to filter and/or adjust the phase of signals being received or transmitted. There are applications in which a deactivation or a bridging of a capacitive device (e.g., a capacitive element) would be useful, allowing for dynamic reconfiguration of circuitry. Certain aspects of the present disclosure are generally directed to a capacitive device in an integrated circuit that can be dynamically deactivated (also referred to as "open-circuited") or bridged (also referred to as "shorted"). Such a capacitive device may be referred to herein as an enhanced reconfigurable capacitor (ERC). An ERC may be used to design circuits (e.g., filters or phase adjusters) that can be dynamically reconfigured based on an operating scenario of a system including one or more ERCs.

Figure 4A:
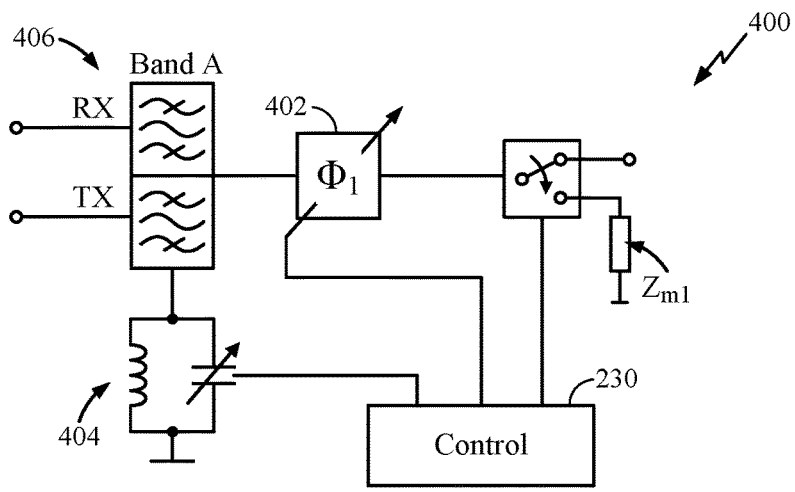
FIGS. 4A and 4B illustrate different configurations of an enhanced multiplexer (EMUX) in an example transceiver front end, in accordance with certain aspects of the present disclosure.
Figure 4B:
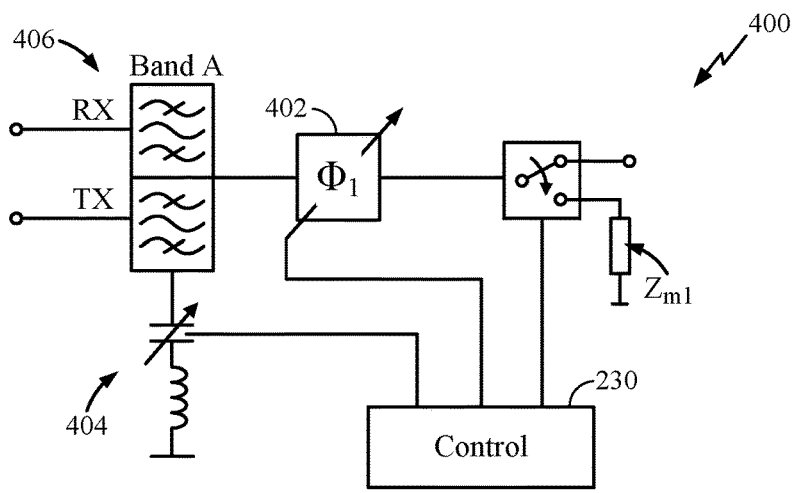

FIGS. 4A and 4B illustrate different configurations of an enhanced multiplexer (EMUX) 400, in accordance with certain aspects of the present disclosure. An EMUX may refer to a multiplexing circuit (e.g., a duplexer) that can be fully reconfigured, which offers the opportunity to vary the phase of a signal by means of ERCs in a phase adjustment circuit 402, as well as varying pole points of a resonance circuit 404 coupled to a duplexer 406 (e.g., in interface 306 of FIG. 3). For example, the realization of the pole points may be implemented with the resonance circuit 404 configured as a parallel resonance circuit as shown in FIG. 4A or configured as a series resonance circuit as shown in FIG. 4B.

Figure 4C:
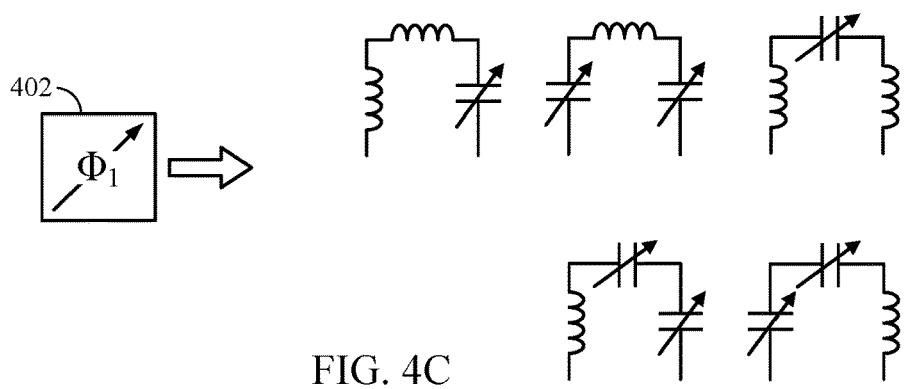
FIG. 4C illustrates different configurations of a phase adjustment circuit, in accordance with certain aspects of the present disclosure.

While FIGS. 4A and 4B illustrate two configurations of a resonance circuit 404 to facilitate understanding, other configurations of the resonance circuit may also be implemented using one or more ERCs which provide the flexibility to dynamically reconfigure the resonance circuit. In certain aspects of the present disclosure, the phase adjustment circuit 402 may be configured using different configurations of capacitors and inductors, as illustrated in FIG. 4C, which may be dynamically reconfigured using ERCs as described in more detail herein.

Figure 5:
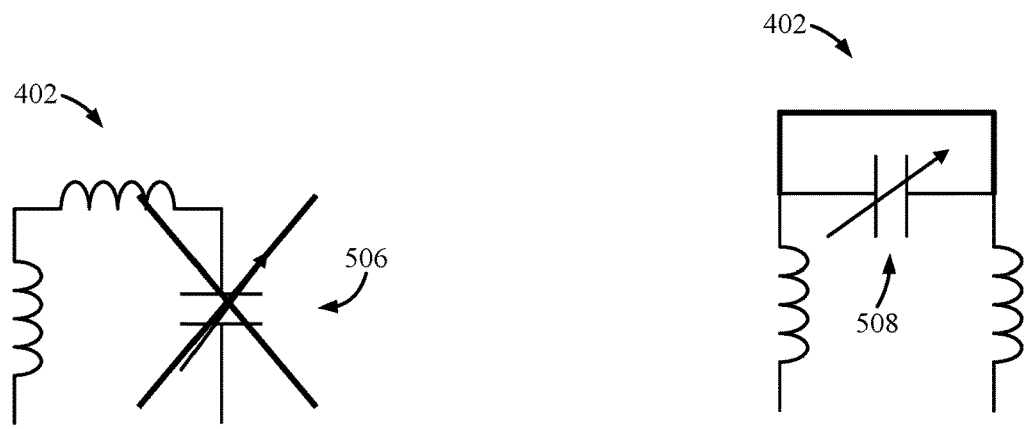
FIG. 5 illustrates deactivating or bridging a capacitor of a phase adjustment circuit, in accordance with certain aspects of the present disclosure.

FIG. 5 illustrates the bridging or deactivation of a capacitor in the phase adjustment circuit 402, in accordance with certain aspects of the present disclosure. For example, depending on the desired phase setting of the filters and duplexers of a communication system, it may be advantageous that certain capacitors are either bridged or deactivated in some operating modes. For example, as illustrated, the capacitor 506 may be deactivated (e.g., open-circuited), whereas capacitor 508 may be bridged (e.g., shorted). The capacitors 506 and 508 may be implemented using an ERC device, allowing for the bridging and/or deactivation of the capacitors.

Figure 6A:
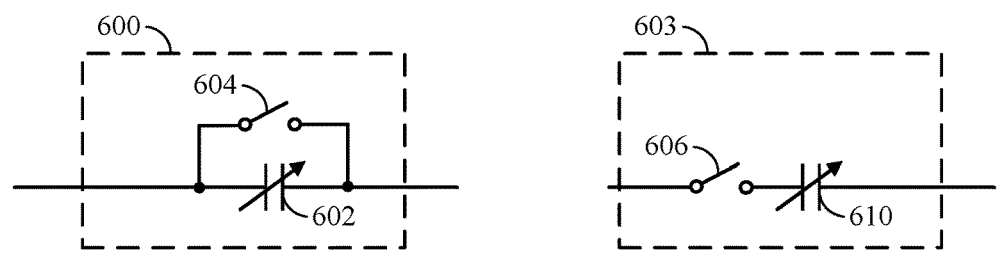
FIGS. 6A and 6B illustrate multiple examples of enhanced reconfigurable capacitors (ERCs), in accordance with certain aspects of the present disclosure.
Figure 6B:
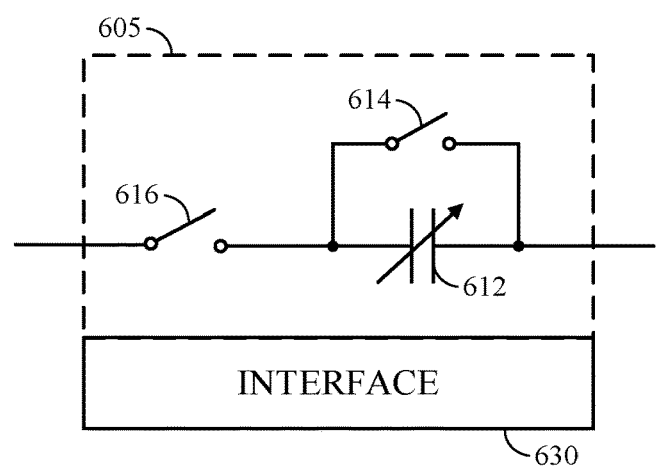

FIGS. 6A and 6B illustrate multiple examples of ERCs 600, 603, and 605, in accordance with certain aspects of the present disclosure. Each of the ERCs 600, 603, 605 may include a capacitor 602, 610, 612 coupled to one or more switches. As illustrated in FIG. 6A, a switch 604 may be coupled in parallel with the capacitor 602, allowing for the ERC 600 to be shorted (e.g., bridged), or a switch 606 may be coupled in series with a capacitor 610, allowing for the ERC 603 to be open-circuited (e.g., deactivated). For certain aspects, the switches may be implemented by transistors. The switches 604 and 606 may be controlled by a controller through, for example, a mobile industry processor interface (MIPI) bus 630, to bridge or deactivate the capacitors 602 and 610. In certain aspects, one or more of the capacitors 602, 610, and 612 may be implemented as a variable capacitive device.

If it is known prior to production whether a capacitor is to be used in a serial path or in a parallel path, a single switch may be used in series or parallel with the capacitor, as illustrated in FIG. 6A. Otherwise, two switches may be used, one in parallel with a capacitor and one in series with the capacitor, as illustrated in FIG. 6B. For example, the ERC 605 may include a switch 614 coupled in parallel with a capacitor 612 allowing for the ERC 605 to be shorted (e.g., bridged), as well as a switch 616 coupled to the capacitor 612 allowing the ERC 605 to be open-circuited (e.g., deactivated), as illustrated.

While the examples provided herein have described a capacitive device that can be bridged or deactivated to facilitate understanding, the techniques provided herein may be applied to any impedance. For example, the capacitors 602, 610, and 612 described with respect to FIGS. 6A and 6B may be replaced with inductors, allowing the inductors to be bridged or deactivated.

Figure 7:
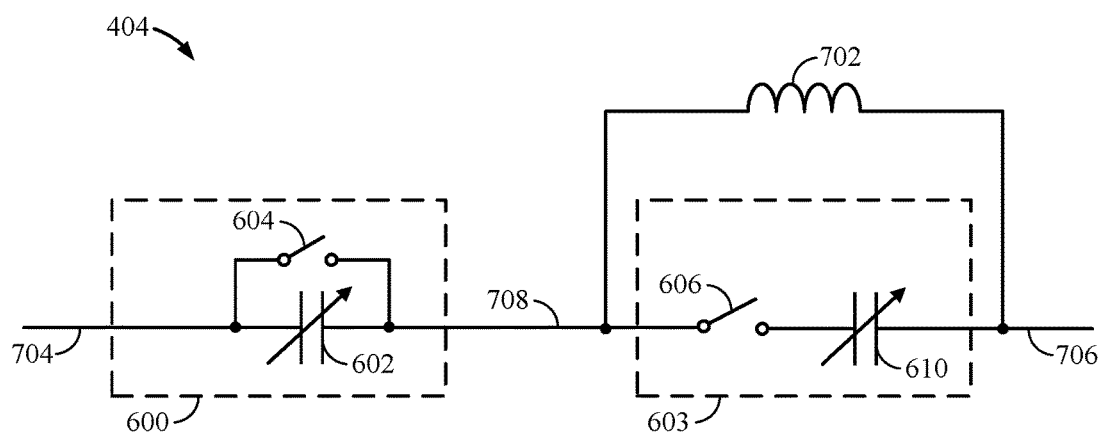
FIG. 7 illustrates a resonance circuit implemented using ERCs, in accordance with certain aspects of the present disclosure.

FIG. 7 illustrates the resonance circuit 404 of FIGS. 4A and 4B implemented using the ERCs 600 and 603 coupled together and to an inductor 702, in accordance with certain aspects of the present disclosure. For example, node 704 may be coupled to the duplexer 406, and node 706 may be coupled to a reference potential node (e.g., electric ground), or vice versa. The inductor 702 may be coupled between the nodes 708 and 706, allowing the resonance circuit 404 to be reconfigured as a parallel resonance circuit or a series resonance circuit, as described with respect to FIGS. 4A and 4B. For example, if switches 604 and 606 are both closed, the resonance circuit 404 is configured as a parallel resonance circuit, whereas if switches 604 and 606 are open, the resonance circuit is configured as a series resonance circuit.

Figure 8:
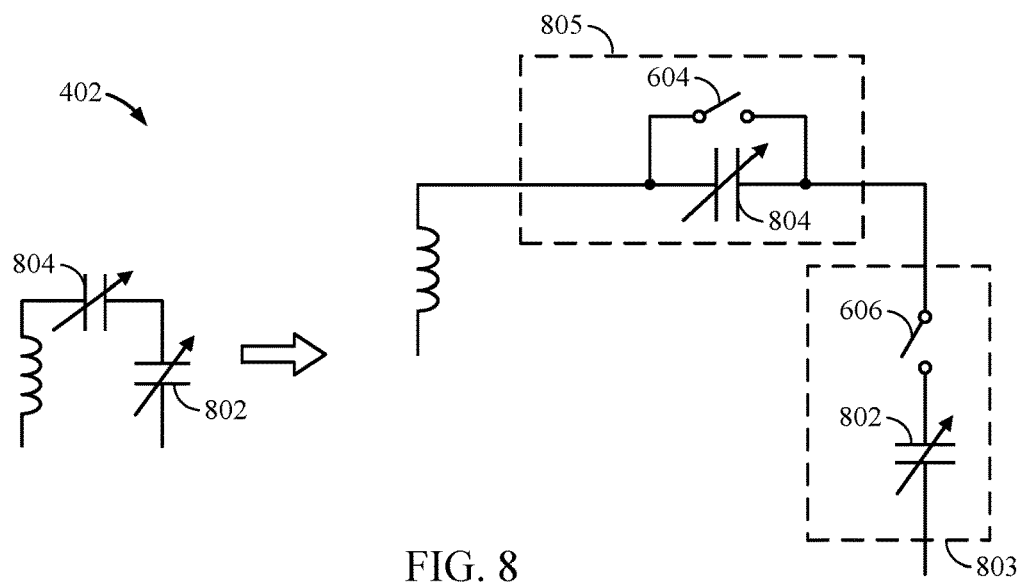
FIG. 8 illustrates a phase adjustment circuit implemented using ERCs, in accordance with certain aspects of the present disclosure

FIG. 8 illustrates the phase adjustment circuit 402, in accordance with certain aspects of the present disclosure. The phase adjustment circuit 402 includes ERCs 803 and 805, implemented with a capacitor 802 or 804, respectively. For example, capacitor 804 may be coupled in parallel with a switch 604, allowing for the ERC 805 to be shorted (e.g., bridged), and the capacitor 802 may be coupled in series with a switch 606, allowing the ERC 803 to be open-circuited. By controlling switches 604 and 606, the phase adjustment circuit 402 may be reconfigured as desired.

Figure 9:
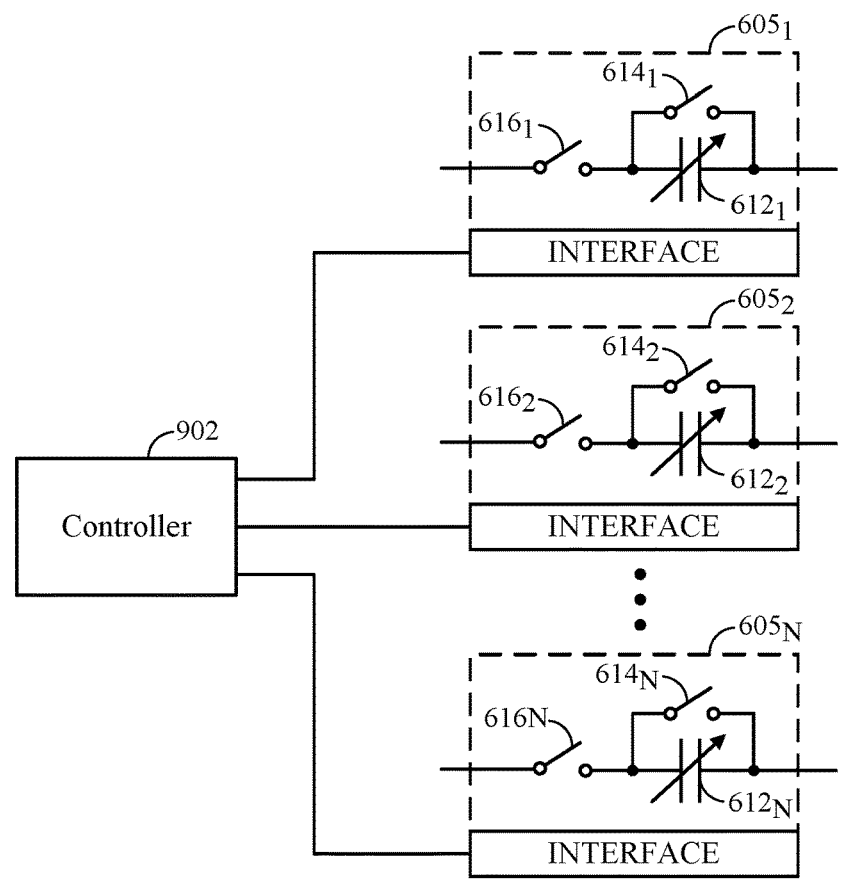
FIG. 9 illustrates a controller for controlling multiple ERCs, in accordance with certain aspects of the present disclosure.

FIG. 9 illustrates controller 902 (e.g., corresponding to controller 230 of FIG. 2) for controlling multiple ERCs $605_1$-$605_N$, in accordance with certain aspects of the present disclosure. For example, the controller 902 may vary the capacitance of capacitors $612_1$-$612_N$, as well as controlling the parallel and series switches $614_1$-$614_N$ and $616_1$-$616_N$ of each of the ERCs 605, as illustrated. In certain aspects, the controller 902 may also control the functionality of the EMUX 400 described with respect to FIGS. 4A and 4B. The controller 902 may be implemented in the same IC as one or more of ERCs 605, or in a separate IC.

Figure 10A:
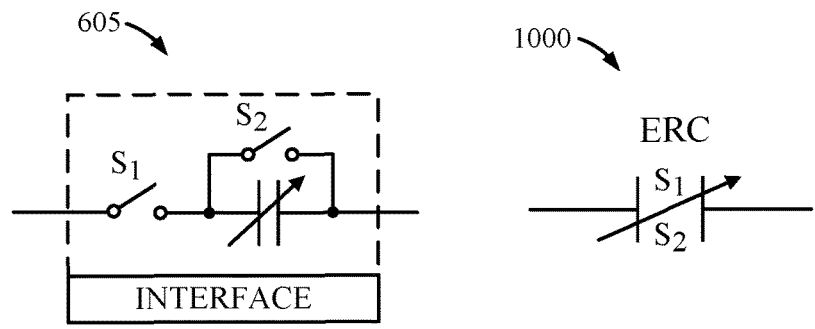
FIG. 10A illustrates an example symbol representing an ERC, in accordance with certain aspects of the present disclosure.
Figure 10B:
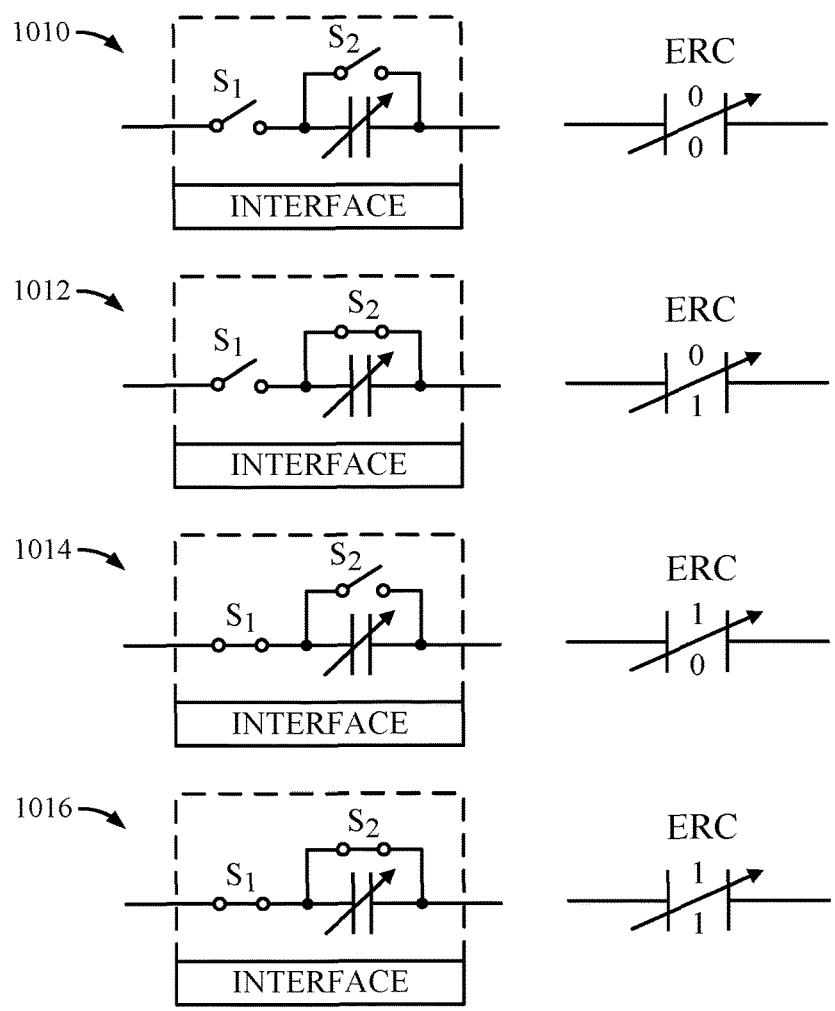
FIG. 10B illustrates the ERC symbol of FIG. 10A being used to indicate various switch states, in accordance with certain aspects of the present disclosure.

FIG. 10A illustrates an example electronic symbol 1000 representing the ERC 605, in accordance with certain aspects of the present disclosure. Such a symbol 1000 may be used in a schematic diagram of an electronic circuit, for example. The symbol 1000 represents the ERC 605 configured to receive two bits to control switches S1 and S2. For example, each of the switches S1 and S2 may have two states, "0" for open and "1" for closed. Therefore, by controlling switches S1 and S2, four different configurations 1010, 1012, 1014, and 1016 of the ERC 605 are possible, as indicated by the various switch states in the ERC symbols of FIG. 10B. The configurations 1010 and 1012 may have the same effect since the ERC is separated from any external circuitry with switch S1 being open. Thus, the state of switch S2 may not influence the function of the ERC 605 in these configurations 1010, 1012, but may be controlled for some applications to adjust the level of electric isolation across the terminals of the ERC 605.

Figure 11:
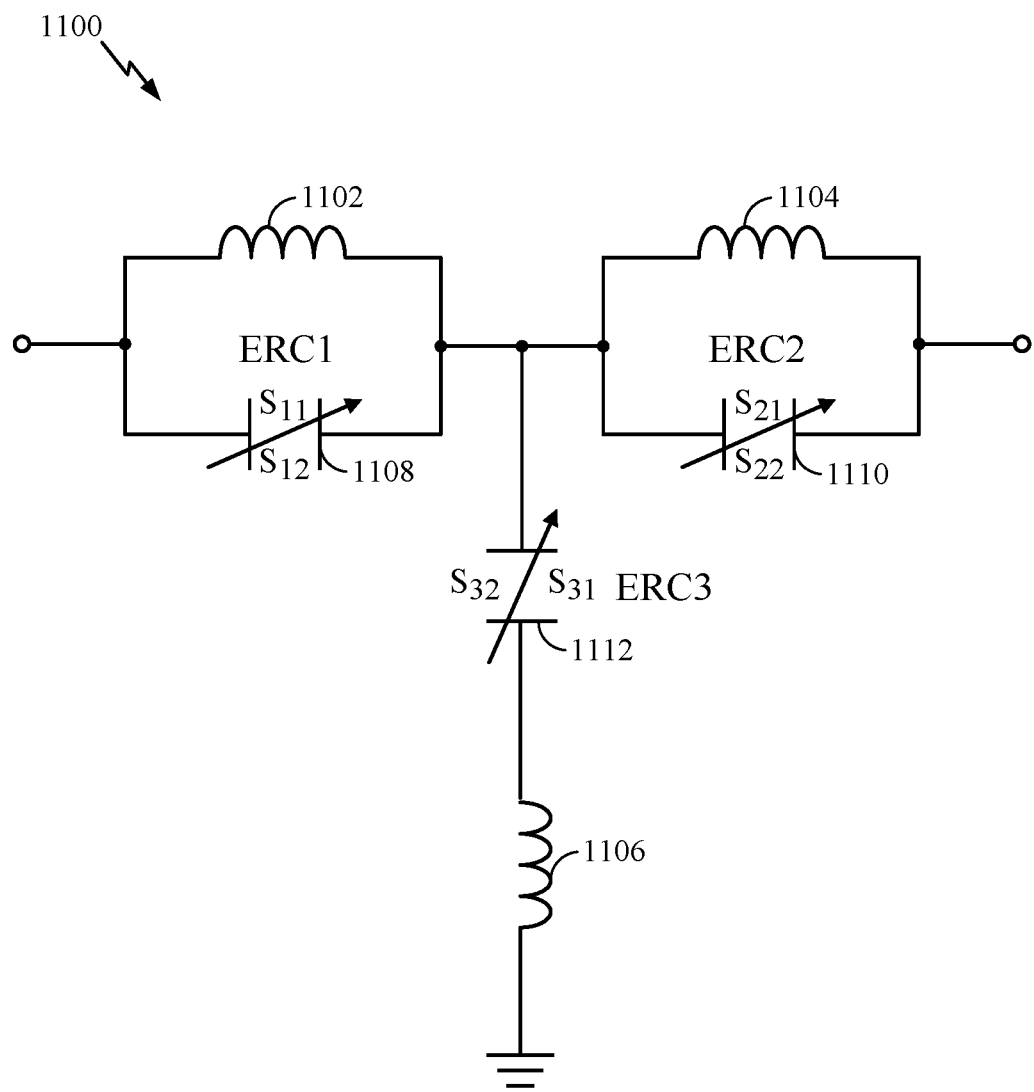
FIG. 11 illustrates an example filter implemented using multiple ERCs, in accordance with certain aspects of the present disclosure.
Figure 12A:
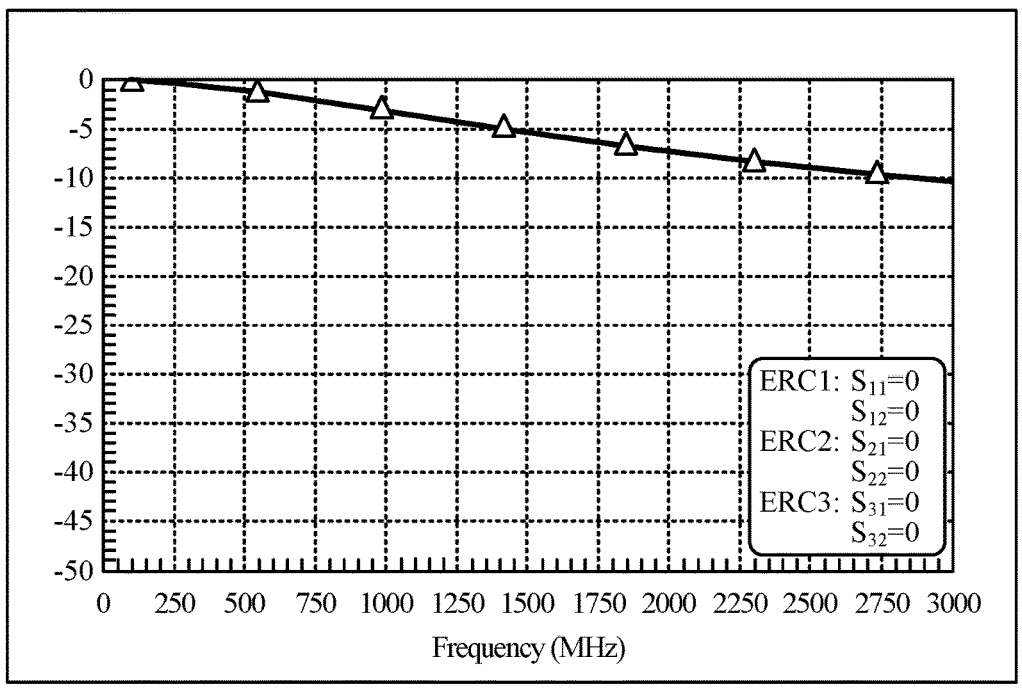
FIGS. 12A-12J are example graphs representing the frequency response of a filter with different ERC switch configurations, in accordance with certain aspects of the present disclosure.
Figure 12B:
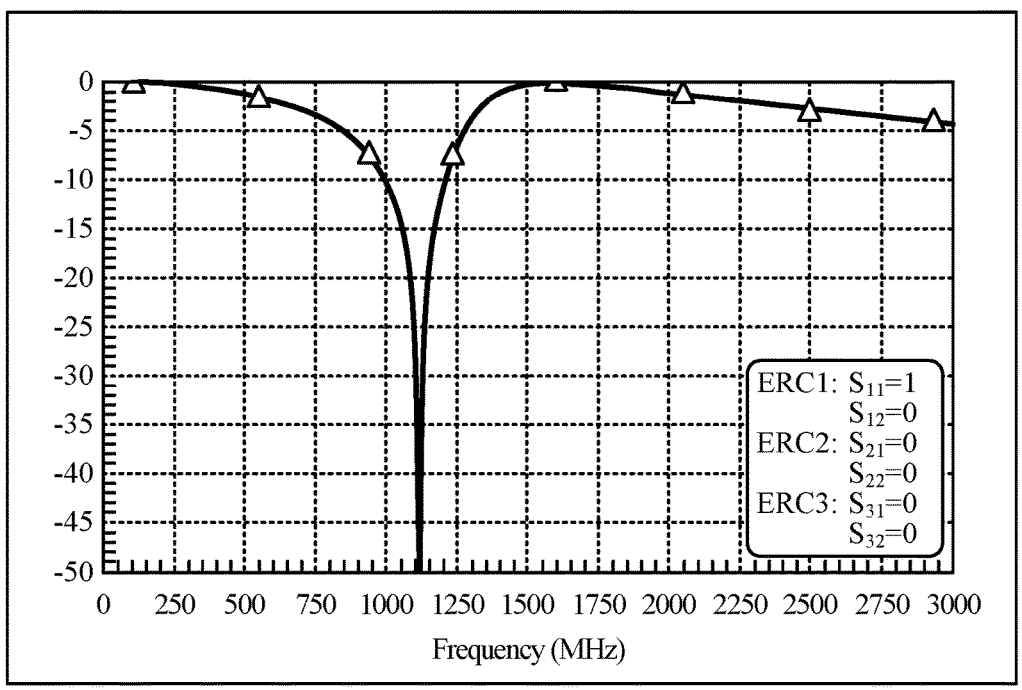
Figure 12C:
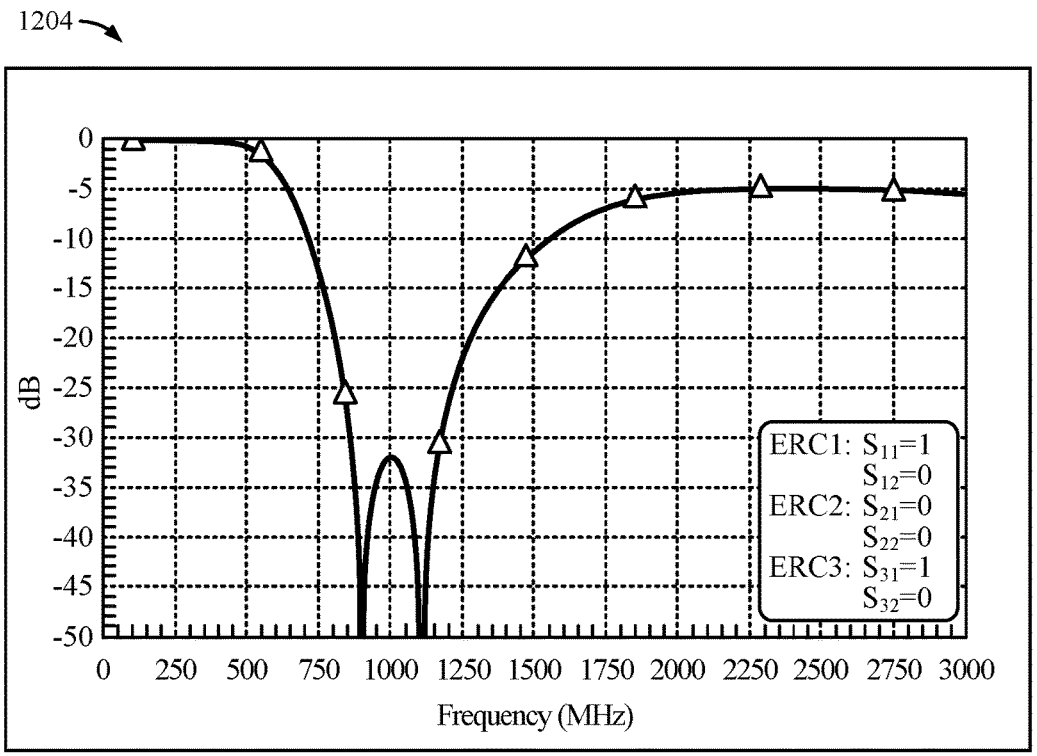
Figure 12D:
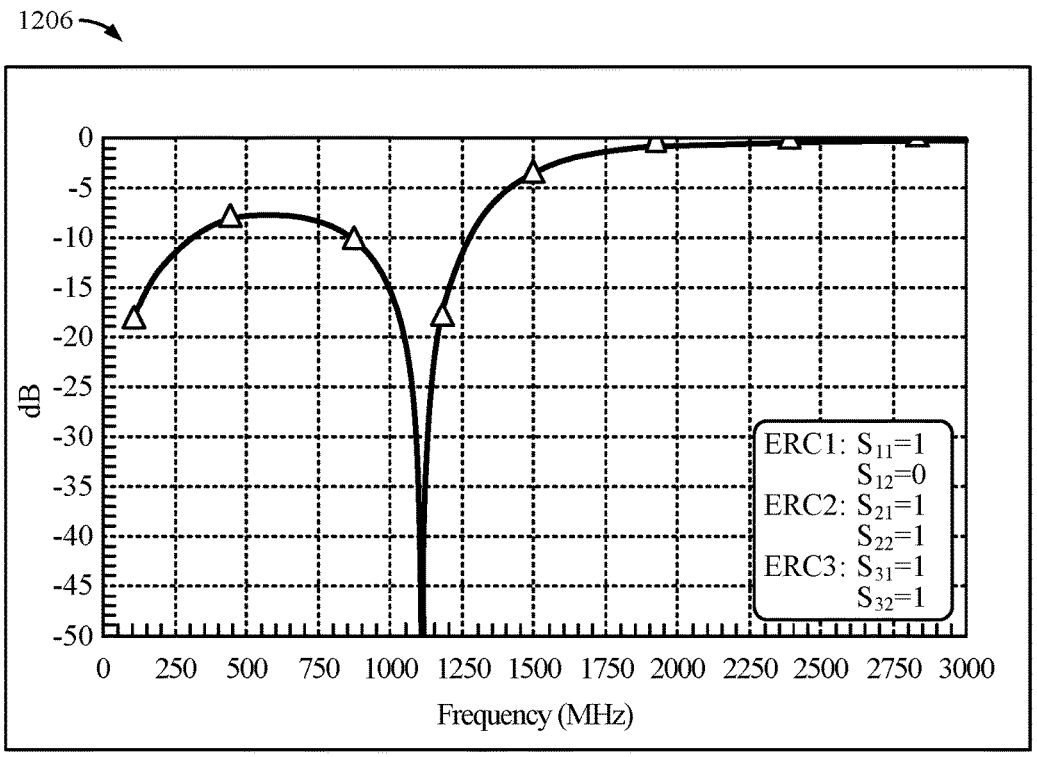
Figure 12E:
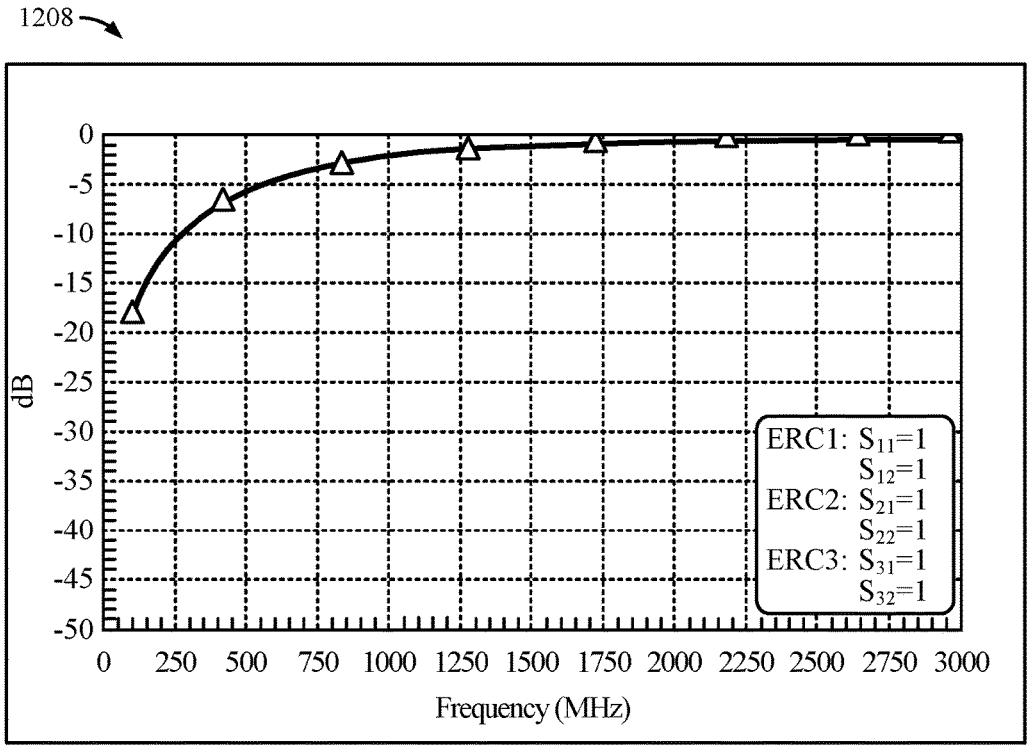
Figure 12F:
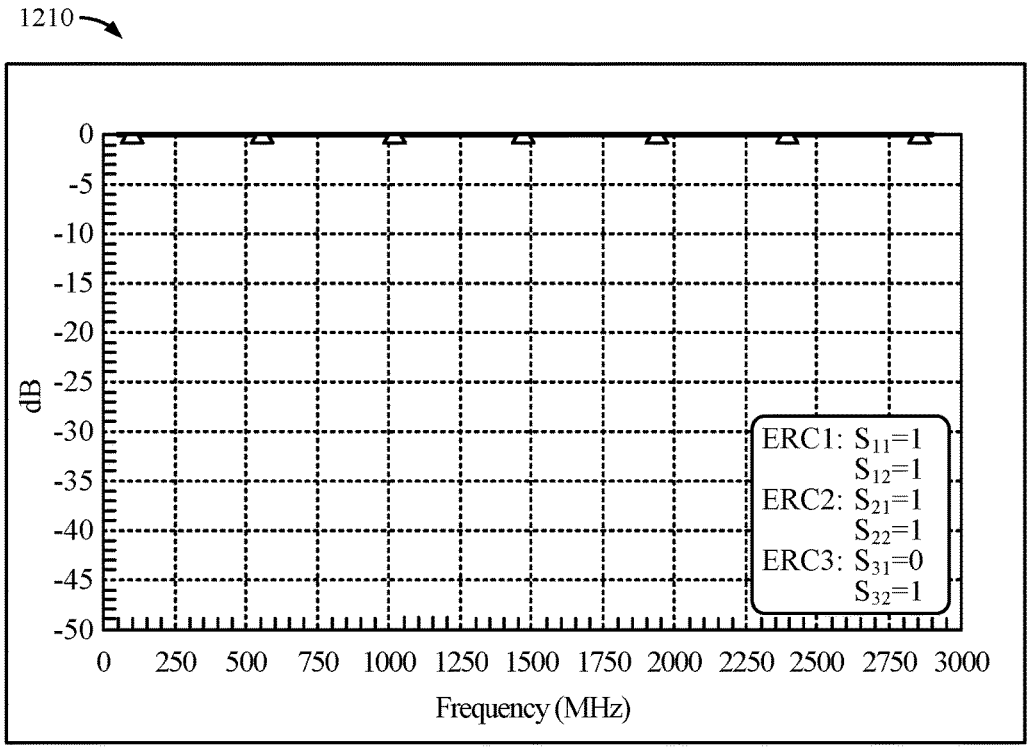
Figure 12G:
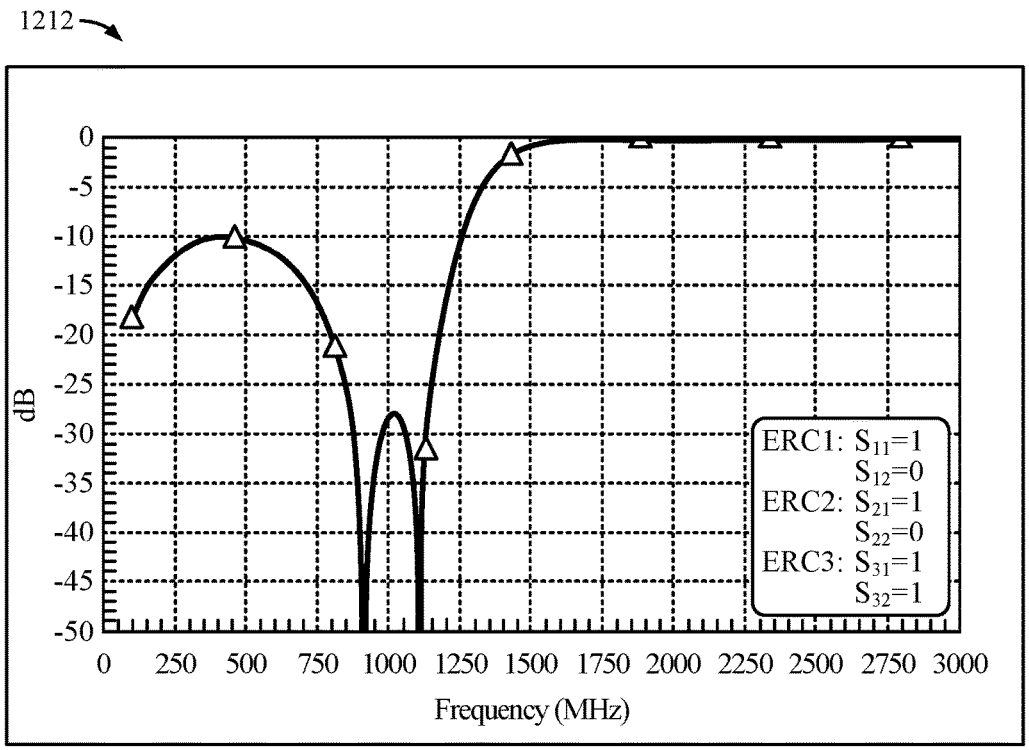
Figure 12H:
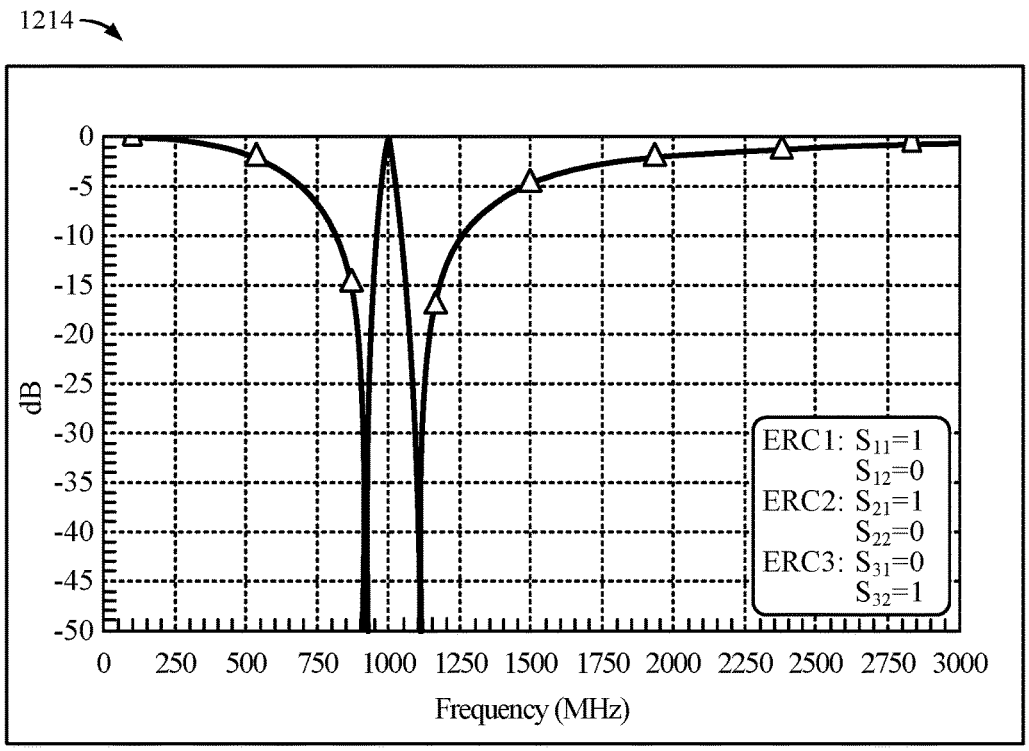
Figure 12I:
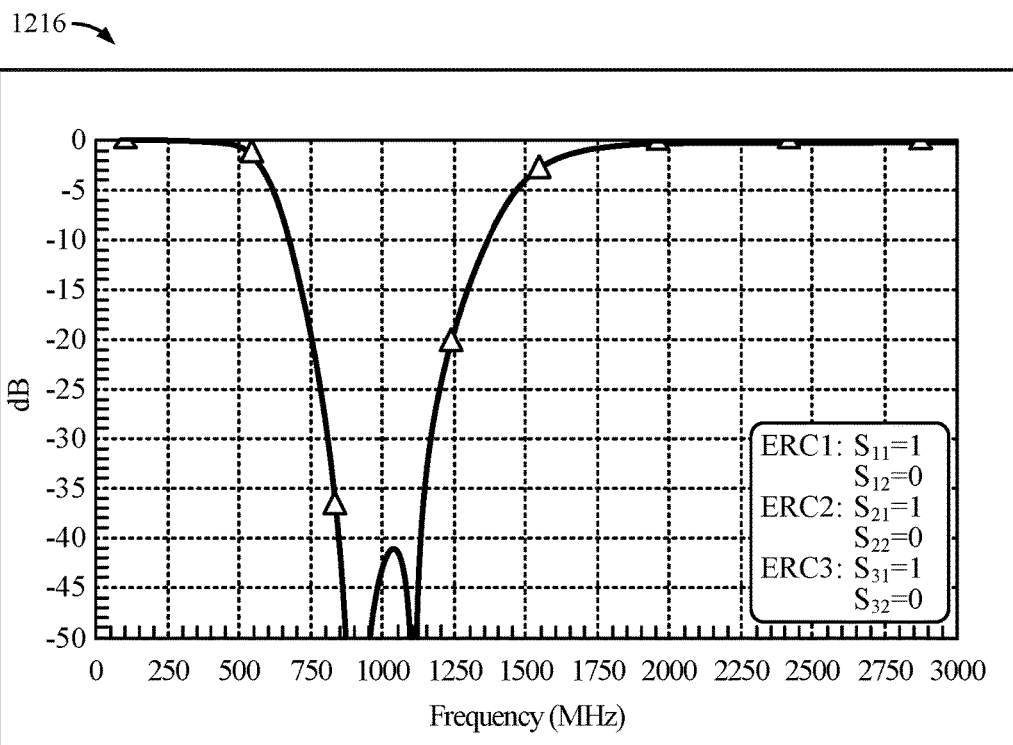
Figure 12J:
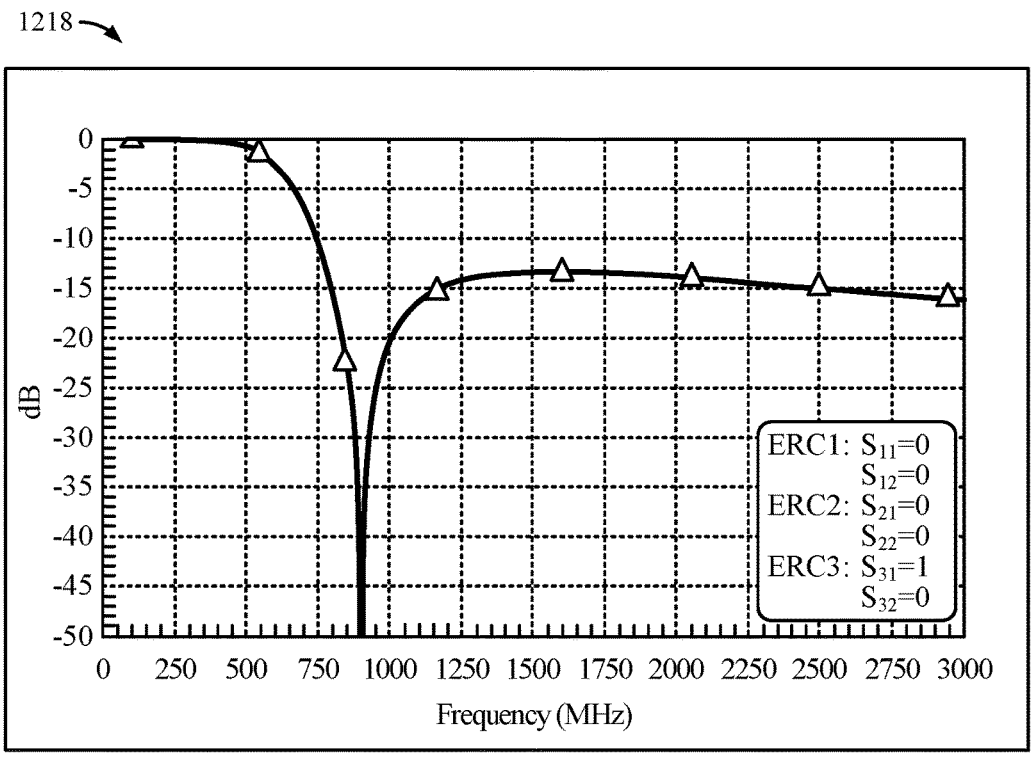

FIG. 11 illustrates a filter 1100 implemented using multiple ERCs 1108, 1110, 1112, in accordance with certain aspects of the present disclosure. The filter 1100 may be used to filter signals in any of various suitable systems. For example, the BBFs 310 and/or 326 of FIG. 3 may include the filter 1100 to filter baseband signals as described with respect to FIG. 3. The two switch positions of the ERCs 1108, 1110, 1112 are represented by nomenclature $S_{n1}$ and $S_{n2}$, with n=1, 2, 3 representing the ERCs 1108, 1110, and 1112, respectively, and with the last digit representing either the series switch ("1") or the parallel switch ("2") in the ERC. Therefore, $S_{11}$ represents the series switch of ERC 1108, $S_{12}$ represents the parallel switch of ERC 1108, $S_{21}$ represents the series switch of ERC 1110, $S_{22}$ represents the parallel switch of ERC 1110, $S_{31}$ represents the series switch of ERC 1112, and $S_{32}$ represents the parallel switch of ERC 1112. As illustrated, the filter 1100 may include inductors 1102 and 1104 coupled in parallel with ERCs 1108 and 1110, respectively, and an inductor 1106 coupled in series with ERC 1112. For certain aspects of the filter 1100, the inductor 1106 and ERC 1112 may be swapped.

The ERC 1112 may be implemented with either the series switch $S_{31}$ or the parallel switch $S_{32}$ being directly coupled to the inductor 1106. For example, in some cases, the series switch $S_{31}$ may be directly coupled to the inductor 1106, and the parallel switch $S_{32}$ may only be coupled to the inductor 1106 when the series switch $S_{31}$ is closed. In other cases, the parallel switch $S_{32}$ may be directly coupled to the inductor 1106, and the series switch $S_{31}$ may only be coupled to the inductor 1106 through the capacitor and/or the parallel switch $S_{32}$ of the ERC 1112.

FIGS. 12A-12J are example graphs 1200, 1202, 1204, 1206, 1208, 1210, 1212, 1214, 1216, 1218, respectively, representing the frequency response curve (e.g., forward transmission parameter $S_{21}$ (not to be confused with switch state $S_{21}$)) of the filter 1100 with different switch configurations, in accordance with certain aspects of the present disclosure. The states of the switches $S_{11}$, $S_{12}$, $S_{21}$, $S_{22}$, $S_{31}$, and $S_{32}$ are represented by states "0" and "1" as described above.

As illustrated, the filter 1100 is reconfigurable to realize different filter transmission curves depending on the switch position. For example, depending on the switch positions as shown, the filter may function as a high pass filter (e.g., as shown in graph 1212 of FIG. 12G), a low pass filter (e.g., as shown in graph 1204 of FIG. 12C), a bandpass filter (e.g., as shown in graph 1214 of FIG. 12H) or a band stop filter (e.g., as shown in graph 1216 of FIG. 12I), as well as a passage filter (e.g., an all-pass filter as shown in graph 1210 of FIG. 12F). As described above, each of the capacitors of the ERCs may be implemented as a variable capacitor. Thus, the frequency response curves can be further influenced by adjusting the capacitance of the ERCs.

Figure 13A:
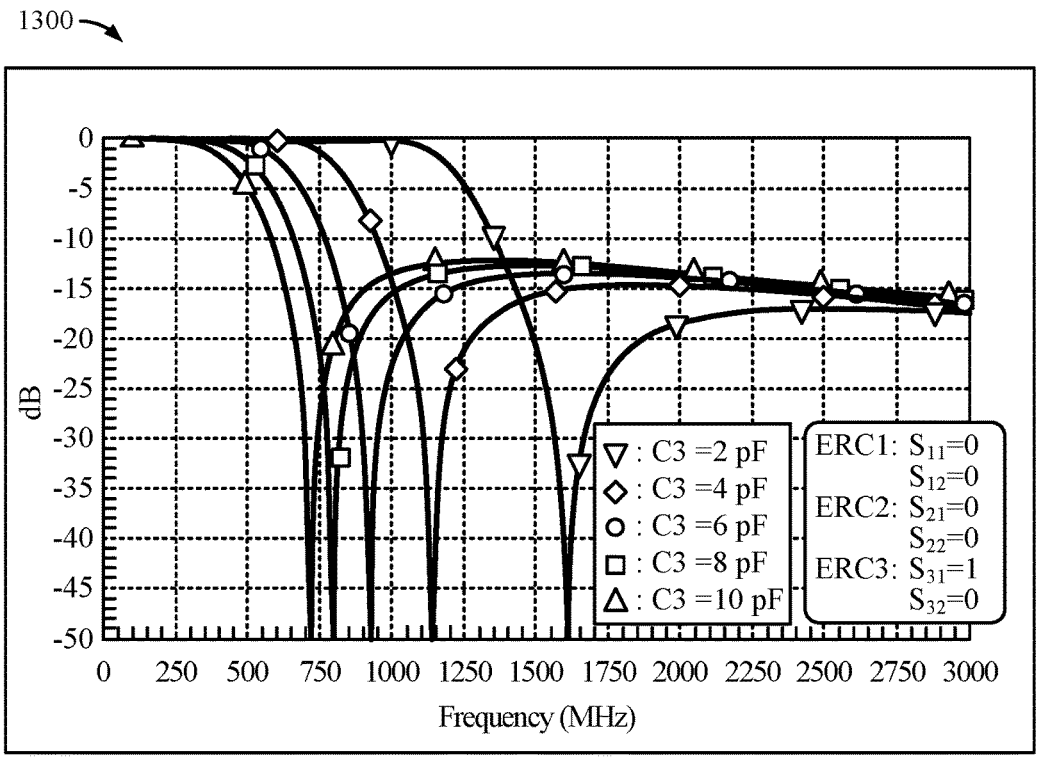
FIGS. 13A and 13B are example graphs representing a frequency response of a filter with different capacitance setting and switch configurations, in accordance with certain aspects of the present disclosure.
Figure 13B:
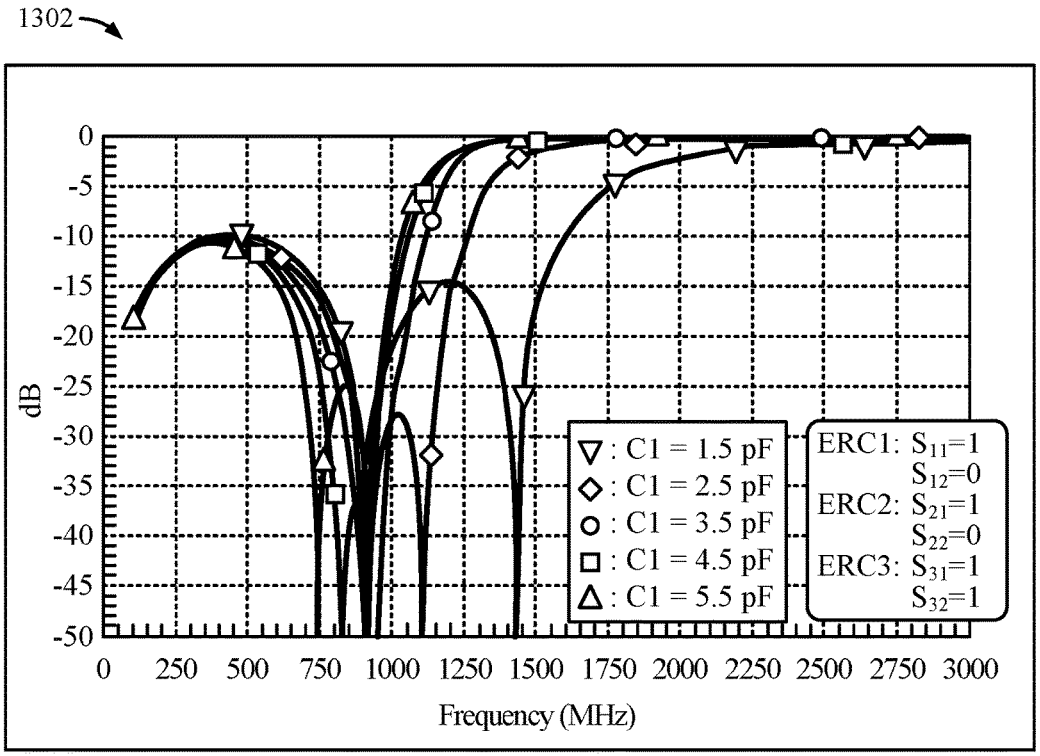

FIGS. 13A and 13B are example graphs 1300 and 1302 representing the frequency responses of the filter 1100 with different capacitance settings for the ERCs 1108, 1110, and 1112 and different switch configurations, in accordance with certain aspects of the present disclosure. For example, as illustrated in FIG. 13A, the 3 dB boundary frequency (also referred to as the cutoff or corner frequency) of a realized low pass filter can be adjusted by varying the capacitance (C3) of the capacitor in ERC 1112 in order to realize a desired frequency response. As illustrated in FIG. 13B, the 3 dB boundary frequency of a realized high pass filter may be adjusted by adjusting the capacitance (C1) of the capacitor in ERC 1108.

In certain aspects, the one or more ERCs as described herein may be implemented using any capacitor having a variable capacitance. For example, the ERCs may be implemented using at least one of a microelectromechanical system (MEMS) capacitor, a digitally tunable capacitor (DTC), an analog tunable capacitor, or an analog varactor, to name a few. In some cases, the ERCs as described herein may be implemented as a transcap device, which is a three-terminal device allowing for dynamic adjustment of the capacitance of the transcap device.

Figure 14:
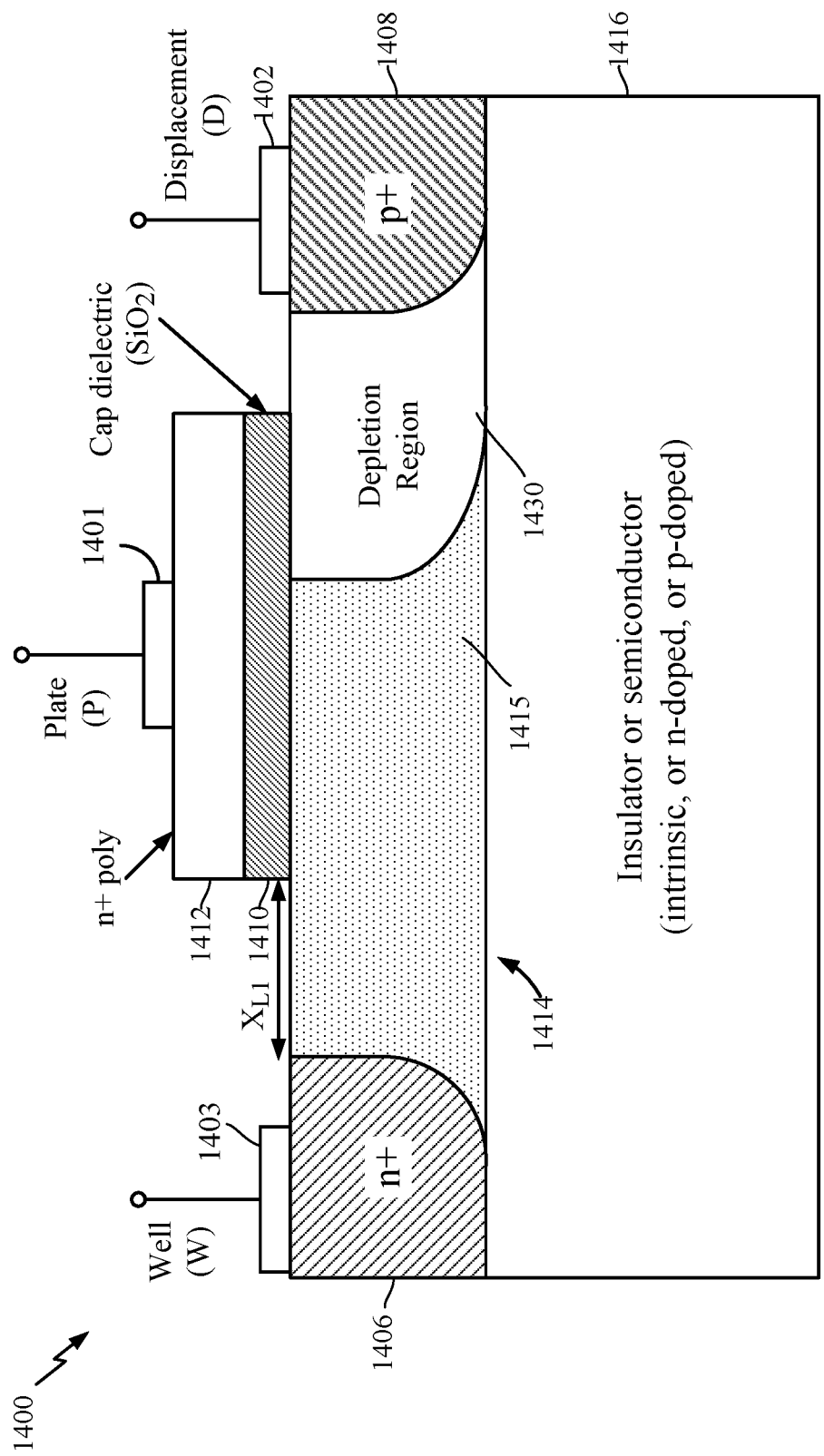
FIG. 14 illustrates an example structure of a transcap device, in accordance with certain aspects of the present disclosure.

FIG. 14 illustrates an example structure of a transcap device 1400, in accordance with certain aspects of the present disclosure. The transcap device 1400 may include a non-insulative region 1412 coupled to a plate (P) terminal 1401, a non-insulative region 1406 coupled to a well (W) terminal 1403, and a non-insulative region 1408 coupled to a displacement (D) terminal 1402. Certain implementations of a transcap device use a plate oxide layer 1410 (e.g., an insulative layer) disposed above a semiconductor region 1414. The plate oxide layer 1410 may isolate the W and P terminals, and thus, in effect act as a dielectric for the transcap device 1400. The non-insulative region 1406 (e.g., heavily n-doped (n+) region) and the non-insulative region 1408 (e.g., heavily p-doped (p+) region) may be formed in the semiconductor region 1414 and on two sides of the transcap device 1400 in order to create p-n junctions. As used herein, a non-insulative region generally refers to a region that may be conductive or semiconductive.

In certain aspects, a bias voltage may be applied between the D terminal 1402 and the W terminal 1403 to modulate the capacitance between the P and W terminals. For example, by applying a bias voltage to the D terminal 1402, a depletion region 1430 may be formed between the p-n junction of the non-insulative region 1408 and the region 1415 of the semiconductor region 1414. Based on the bias voltage, this depletion region 1430 may widen under the plate oxide layer 1410, reducing the area of the equivalent electrode formed by the semiconductor region 1414, and with it, the effective capacitance area and capacitance value of the transcap device 1400. Furthermore, the bias of the W and P terminals may be set as to avoid the formation of an inverted region underneath the oxide and operate the transcap device 1400 in deep depletion mode.

The work-function of the non-insulative region 1412 above the plate oxide layer 1410 may be chosen to improve the device performance. For example, an n-doped polysilicon material may be used (instead of p-doped), even if the semiconductor region 1414 underneath the plate oxide layer 1410 is doped with n-type impurities. In some aspects, a metallic material (also doped if desired) may be used for the non-insulative region 1412 with an opportune work-function or a multi-layer stack of different metallic materials to obtain the desired work-function. In certain aspects, the non-insulative region 1412 may be divided into two sub-regions, one n-doped and one p-doped, or a different metallic material may be used for each sub-region.

In some cases, the semiconductor region 1414 may be disposed above an insulator or semiconductor region 1416. The type of material for the insulator or semiconductor region 1416 may be chosen in order to improve the transcap device 1400 performance. For example, the insulator or semiconductor region 1416 may be an insulator, a semi-insulator, or an intrinsic/near-intrinsic semiconductor in order to decrease the parasitic capacitances associated with the transcap device 1400. In some cases, the insulator or semiconductor region 1416 may be made of n-doped or p-doped semiconductor with an appropriate doping profile in order to increase the transcap device quality factor (Q) and/or the control on the depletion region 1430 that may be formed between the non-insulative region 1408 and the region 1415 of the semiconductor region 1414 when applying a bias voltage to the D terminal 1402. The insulator or semiconductor region 1416 may also be formed by multiple semiconductor layers or regions doped in different ways (n, p, or intrinsic). Furthermore, the insulator or semiconductor region 1416 may include semiconductors, insulating layers, and/or substrates or may be formed above semiconductors, insulating layers, and/or substrates.

To better understand the working principle of the transcap device 1400, it may be assumed that the D terminal 1402 is biased with a negative voltage with respect to the W terminal 1403. The width of the depletion region 1430 in the semiconductor region 1414 may be controlled by applying a control voltage to the D terminal 1402 or to the W terminal 1403. The capacitance between the W and P terminals may depend on the width of the depletion region 1430 in the semiconductor region 1414, and thus, may be controlled by applying the control voltage to the D terminal 1402. Furthermore, the variation of the bias voltage applied to the D terminal 1402 may not alter the direct-current (DC) voltage between the W and P terminals, allowing for improved control of the device characteristics.

In some cases, it may be preferable to have the non-insulative region 1406 and/or non-insulative region 1408 a distance away from the plate oxide layer 1410 in order to reduce the parasitic capacitance associated with the non-insulative region 1408 and improve the isolation of the non-insulative region 1406 for high control voltages. For example, the non-insulative region 1406 may be partially overlapped with the plate oxide layer 1410, or the non-insulative region 1406 may be formed at a distance ($X_{L1}$) from the edge of the plate oxide layer 1410 to increase the device tuning range and linearity. In the latter case, the voltage-withstanding capability of the device is improved since a portion of an RF signal, that may be applied to the P and W terminals, drops between the oxide edge and the non-insulative region 1406 instead of being applied entirely across the plate oxide layer 1410. The non-insulative region 1408 may be partially overlapped with the plate oxide layer 1410, or the non-insulative region 1408 may be spaced apart so as to reduce the parasitic capacitance between the P terminal 1401 and the D terminal 1402.

In certain aspects, the semiconductor region 1414 may be implemented with a p-well region to improve the breakdown voltage of the p-n junction between the non-insulative region 1408 and the region 1415 of the semiconductor region 1414, decreasing, at the same time, the parasitic capacitance between the P terminal 1401 and the D terminal 1402, as described in more detail herein. Similarly, the semiconductor region 1414 may be implemented with an n-doped region between the non-insulative region 1406 and the region 1415 of the semiconductor region 1414 in order to regulate the doping concentration between the plate oxide layer 1410 and the non-insulative region 1406, as described in more detail herein. In certain aspects of the present disclosure, the semiconductor region 1414 may be implemented with two or more regions having different doping concentrations and/or different doping types. A junction between the two or more regions may be disposed below the plate oxide layer 1410 to improve the Q of the transcap device 1400.

As mentioned above, certain aspects of the present disclosure provide an ERC implemented using a transcap device as the capacitive device (e.g., capacitor 602, 610, or 612). For example, a parallel switch 604 may be coupled between the P terminal 1401 and the W terminal 1403 of the transcap device 1400, and/or a series switch 606 may be coupled to the P terminal 1401 or the W terminal 1403. Thus, the transcap device 1400 can be short-circuited by closing switch 604, or disconnected from a remaining portion of a circuit by opening switch 606. In addition, the capacitance of the transcap device 1400 may be adjusted by altering a capacitance between the P terminal 1401 (or W terminal 1403) and D terminal 1402 as described above.

Figure 15:
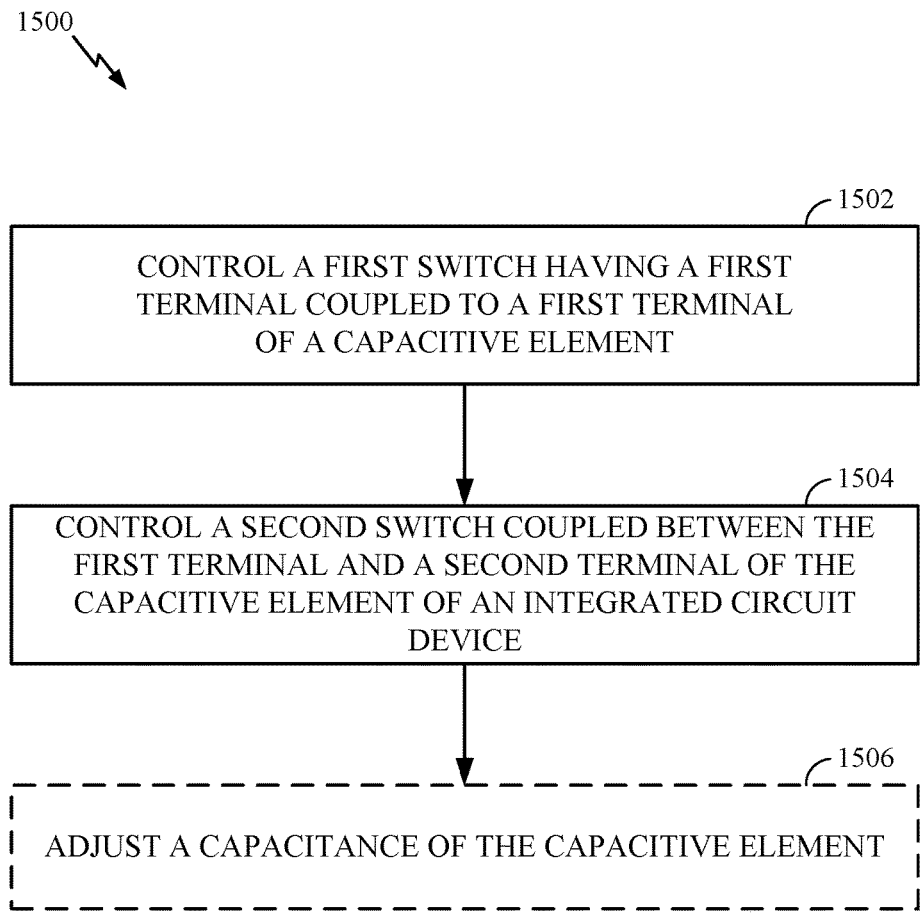
FIG. 15 is a flow diagram illustrating example operations for controlling an integrated circuit device, in accordance with certain aspects of the present disclosure.

FIG. 15 is a flow diagram illustrating example operations 1500 for controlling operations of an integrated circuit device such as an integrated circuit having a resonance circuit or a filter, in accordance with certain aspects of the present disclosure. The operations 1500 may be performed by a controller, such as the controller 230 of FIGS. 4A and 4B.

The operations 1500 may begin, at block 1502, by controlling a first switch (e.g., switch 606) having a first terminal coupled to a first terminal of a capacitive element (e.g., capacitor 602). At block 1504, a second switch (e.g., switch 604) coupled between the first terminal and a second terminal of the capacitive element of the integrated circuit device may be controlled. In certain aspects, the first and second switches may be controlled to configure a resonance circuit (e.g., resonance circuit 404) having the capacitive element from a first configuration to a second configuration. For example, the first configuration may be a parallel resonance circuit configuration, and the second configuration may be a series resonance circuit configuration.

In certain aspects, the operations 1500 may also include selectively coupling an impedance (e.g., capacitor 610) between the capacitive element and a reference potential node. For example, the impedance may be coupled between a second terminal of the first switch and the reference potential node. In certain aspects, the operations 1500 may optionally include, at block 1506, adjusting a capacitance of the capacitive element.

The various operations of methods described above may be performed by any suitable means capable of performing the corresponding functions. The means may include various hardware and/or software component(s) and/or module(s), including, but not limited to a circuit, an application-specific integrated circuit (ASIC), or processor. Generally, where there are operations illustrated in figures, those operations may have corresponding counterpart means-plus-function components with similar numbering. For example, means for selectively coupling may comprise a switch (e.g., the switch 604 or 606 of FIG. 6A), which may be implemented by a transistor, where the operation of the switch may be controlled by a controller (e.g., the controller 902 of FIG. 9). Means for adjusting a capacitance may comprise a controller, such as the controller 902 of FIG. 9.

As used herein, the term "determining" encompasses a wide variety of actions. For example, "determining" may include calculating, computing, processing, deriving, investigating, looking up (e.g., looking up in a table, a database, or another data structure), ascertaining, and the like. Also, "determining" may include receiving (e.g., receiving information), accessing (e.g., accessing data in a memory), and the like. Also, "determining" may include resolving, selecting, choosing, establishing, and the like.

As used herein, a phrase referring to "at least one of" a list of items refers to any combination of those items, including single members. As an example, "at least one of: a, b, or c" is intended to cover: a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

The various illustrative logical blocks, modules and circuits described in connection with the present disclosure may be implemented or performed with a general purpose processor, a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the physical (PHY) layer. In the case of a user terminal, a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC with the processor, the bus interface, the user interface in the case of an access terminal), supporting circuitry, and at least a portion of the machine-readable media integrated into a single chip, or with one or more FPGAs, PLDs, controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An integrated circuit device comprising:
    a variable capacitive element;
    a first switch having a first terminal coupled to a first terminal of the capacitive element; and
    a second switch coupled between the first terminal and a second terminal of the capacitive element in the integrated circuit device.

2. The integrated circuit device of claim 1, further comprising:
    an impedance coupled between a second terminal of the first switch and the second terminal of the capacitive element.

3. The integrated circuit device of claim 1, further comprising:
    a first impedance selectively coupled between the capacitive element and a reference potential node.

4. The integrated circuit device of claim 3, wherein the first impedance is coupled between a second terminal of the first switch and the reference potential node.

5. The integrated circuit device of claim 3, further comprising:
    a second impedance coupled between the capacitive element and the reference potential node.

6. The integrated circuit device of claim 1, further comprising:
    a resonance circuit, the resonance circuit comprising the first switch, the second switch, and the capacitive element.

7. The integrated circuit device of claim 1, further comprising:
    an impedance having a first terminal coupled to a second terminal of the first switch or the second terminal of the capacitive element, and having a second terminal coupled to a reference potential node.

8. The integrated circuit device of claim 1, further comprising:
    a phase adjustment circuit, the phase adjustment circuit comprising the first switch, the second switch, and the capacitive element.

9. The integrated circuit device of claim 1, wherein the variable capacitive element comprises a transcap device, the transcap device comprising:
    a first non-insulative region having a first doping type;
    a second non-insulative region having a second doping type;
    a semiconductor region between the first non-insulative region and the second non-insulative region; and
    a third non-insulative region disposed adjacent to the semiconductor region and electrically isolated from the semiconductor region by an insulative layer, wherein a capacitance of the transcap device is configured to be adjusted by adjusting a voltage applied between the first non-insulative region and the second or third non-insulative region.

10. An apparatus comprising the integrated circuit device of claim 1, the apparatus further comprising:
    a controller configured to control at least one of the first switch or the second switch.

11. The apparatus of claim 10, wherein the integrated circuit device further comprises the controller.

12. A method for controlling operation of an integrated circuit device, comprising:
    controlling a first switch having a first terminal coupled to a first terminal of a capacitive element;
    controlling a second switch coupled between the first terminal and a second terminal of the capacitive element of the integrated circuit device; and
    adjusting a capacitance of the capacitive element.

13. The method of claim 12, wherein the first switch and the second switch are controlled to configure a resonance circuit including the capacitive element from a first configuration to a second configuration.

14. The method of claim 13, wherein the first configuration comprises a parallel resonance circuit configuration and wherein the second configuration comprises a series resonance circuit configuration.

15. The method of claim 12, further comprising:
    selectively coupling an impedance between the capacitive element and a reference potential node.

16. The method of claim 15, wherein the impedance is coupled between a second terminal of the first switch and the reference potential node.

17. An apparatus for processing a signal, comprising:
    means for selectively coupling a first terminal to a second terminal of a variable capacitive element in an integrated circuit device;
    means for selectively coupling the first terminal of the variable capacitive element to a node of the integrated circuit device; and
    means for adjusting a capacitance of the variable capacitive element.

* * * * *